United States Patent [19]
Zimnicki et al.

[11] Patent Number: 5,495,135
[45] Date of Patent: Feb. 27, 1996

[54] PIEZOELECTRIC RESONATOR WITH AN ATTENUATED SPURIOUS RESPONSE

[75] Inventors: Charles Zimnicki, Schaumburg; Kevin Haas, Hoffman Estates; Iyad Alhayek, Schaumburg, all of Ill.

[73] Assignee: Motorola, Inc., Schaumburg, Ill.

[21] Appl. No.: 310,026

[22] Filed: Sep. 21, 1994

[51] Int. Cl.⁶ .................................. H01L 41/08
[52] U.S. Cl. ............................ 310/312; 310/320
[58] Field of Search .................. 310/312, 320, 310/363–366

[56] References Cited

U.S. PATENT DOCUMENTS

| | | | |
|---|---|---|---|
| 2,546,321 | 3/1951 | Ruggles | 310/312 |
| 3,382,381 | 5/1968 | Horton | 310/312 |
| 3,898,489 | 8/1975 | Grady et al. | 310/320 |
| 4,050,126 | 9/1977 | Ikeno et al. | 310/312 X |
| 4,184,095 | 1/1980 | Stacchiotti et al. | 310/366 |
| 4,447,753 | 5/1984 | Ochiai | 310/312 |
| 4,484,382 | 11/1984 | Kawashima | 310/312 X |
| 4,562,370 | 12/1985 | Van Dach | 310/312 |
| 4,870,313 | 9/1989 | Hirama et al. | 310/320 |
| 4,894,577 | 1/1990 | Okamoto et al. | 310/320 |
| 5,032,755 | 7/1991 | Witte | 310/312 |
| 5,078,834 | 1/1992 | Witte | 156/656 |

*Primary Examiner*—Mark O. Budd
*Attorney, Agent, or Firm*—Gary J. Cunningham

[57] ABSTRACT

A piezoelectric resonator (10) with an attenuated spurious response. The resonator (10) includes a piezoelectric crystal plate (12) having opposite surfaces (14, 16), an electrode (18, 24) positioned and overlying relationship on each of the opposite surfaces (14, 16), the electrodes (18, 24) being substantially coextensive and opposite, and providing a primary frequency mode of operation and spurious modes upon suitable energization, and a number of mass loading structures (34) on at least one of the surfaces (14, 16) substantially surrounding at least one of the electrodes (18, 24).

13 Claims, 2 Drawing Sheets

PIEZOELECTRIC RESONATOR WITH AN ATTENUATED SPURIOUS RESPONSE

FIELD OF THE INVENTION

This invention relates generally to frequency control devices and, in particular, to a piezoelectric resonator with an attenuated spurious response.

BACKGROUND OF THE INVENTION

One of the problems encountered with piezoelectric resonators are the unwanted spurious responses, clustered around the fundamental and overtone responses.

The exact level of spurious (unwanted) responses is difficult to predict in advance, before the physical piezoelectric device is actually built. However, the general relationship of the spur response level to different device parameters is well known. The theory relating the piezoelectric device physical properties to the presence and level of spurious responses, is known as the Energy Trapping Theory. According to the theory, one of the parameters strongly affecting the existence of spurious responses, is so-called "mass loading". In a simple case, this parameter can be related to the actual mass of the metal electrode of the piezoelectric device. More precisely, the factor of primary importance is the difference between the mass per unit area of the electroded region and the mass per unit area of the unelectroded region of the device. In many commercial devices, this parameter is controlled by the choice of electrode metal and the thickness of the electrode.

Controlling the spurious responses becomes even more critical with overtone devices. The existence of spurious responses in overtone devices can be minimized when lightweight metal, such as aluminum, is used and the electrode thickness is kept to a minimum, but which is still sufficient to maintain electrical conductivity.

This invention relates to reducing the mass loading effect through an approach different from simply reducing the electrode mass.

There exists a need for an improved arrangement for fabricating piezoelectric resonators, such as quartz crystal blanks, in which unwanted spurious responses can be minimized.

A structure which helps minimize unwanted spurs in fundamental and overtone responses, would be considered an improvement in the art.

DETAILED DESCRIPTION OF THE PREFERRED EMBODIMENT

Figure 1:
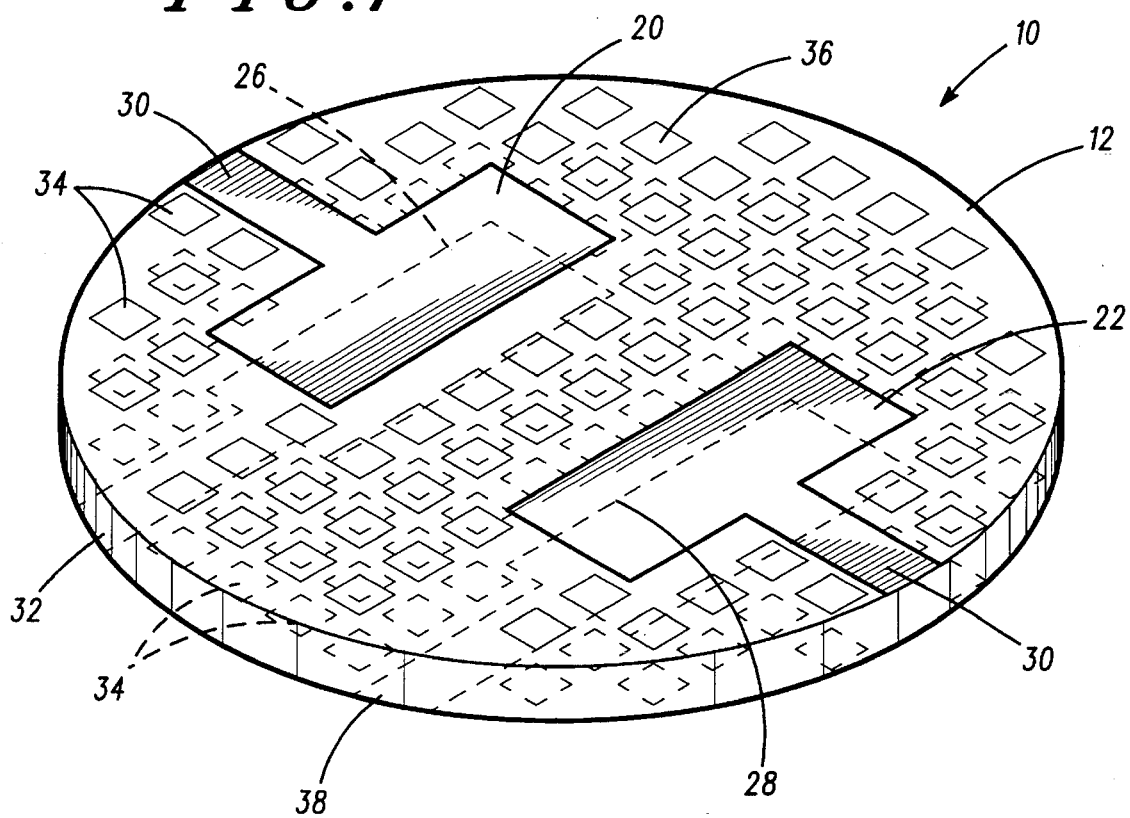
FIG. 1 is a simplified perspective view of a circular crystal blank with mass loading structures surrounding the electrodes (or tiles), some of the tiles on the bottom are shown in phantom, in accordance with the present invention.

In FIG. 1, a piezoelectric resonator with an attenuated spurious response is shown, in accordance with the present invention. In its simplest form, the resonator 10, includes a piezoelectric crystal plate 12 having opposite top and bottom surfaces 14 and 16; top and bottom electrodes 18 and 24 positioned in overlying relationship on each of the first and second (top and bottom) surfaces 14 and 16, the electrodes 18 and 24 being substantially coextensive and opposite, and providing a primary frequency mode of operation and spurious modes upon suitable energization; and a plurality of mass loading structures 34 on at least one of the surfaces substantially surrounding at least one of the electrodes 18 and 24. Preferably, the top and bottom electrodes 18 and 24 each includes a tab 30 and 32, for suitable electrical connection to a power source.

Figure 4:
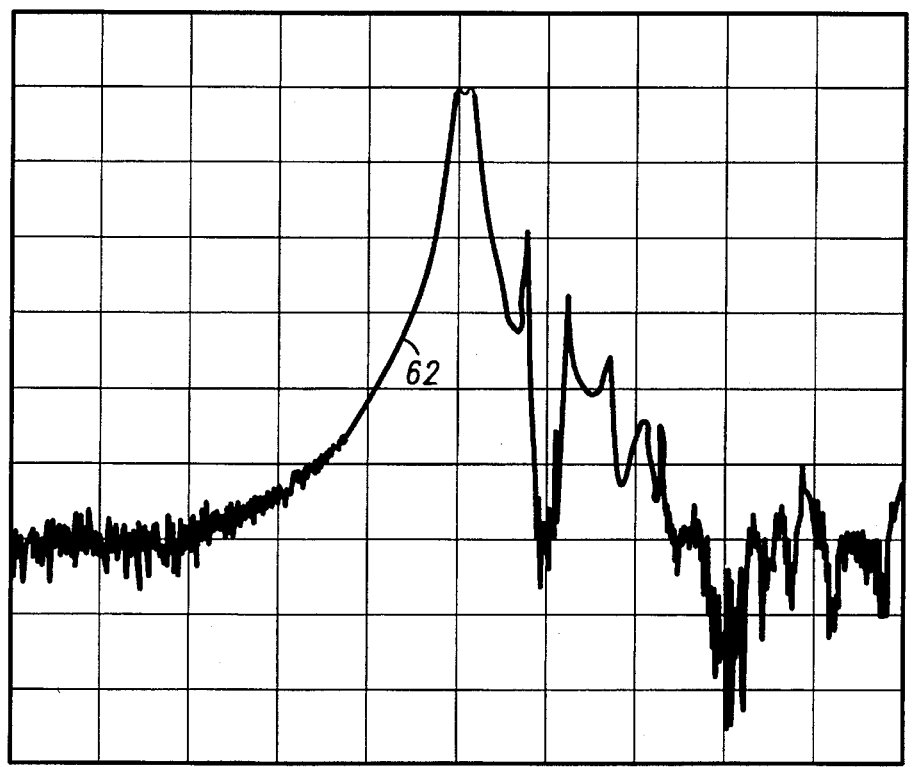
FIG. 4 is a frequency response of the crystal blank shown in FIG. 1 in accordance with the present invention.

This structure addresses reducing the mass loading effect through an approach different from simply reducing the electrode mass. A substantially uniform pattern of masses (or structures) can be deposited in proximity to the electrode 18. These structures increase the mass loading in the non-electroded region of the piezoelectric device. Because of this, the difference in mass loading between the electroded region and the non-electroded region is minimized. This can result in reducing the level of spur responses, as illustrated in FIG. 4.

Although there are distinct advantages to using precious metals for electrode material, their use is almost exclusively restricted to fundamental mode devices. This is because common precious metals, such as gold and metal, are heavy and would mass load an overtone device excessively, which in turn would produce high levels of spur responses. This invention provides for improved manufacturing flexibility, by allowing the use of heavy metals as an electrode material for overtone devices (as well as fight metals), if desired.

In more detail, the plurality of mass loading structures 34 include first (top) structures 36 on first (top) surface 14 and second (bottom) structures 38 on second surface 16, with piezo spacings 40 between adjacent structures 34 and piezo spacings 42 between these structures 36 and 38 and the electrodes 18 and 24. These spacings 40 and 42 comprise the piezoelectric material itself. The region in proximity to the electrodes 18 and 24 can be defined as an electroded region 44 and the region surrounding the electrodes can be referred to as a surrounding region 46. The spacings 40 and 42 are substantially similar to minimize the mass loading effect and are non-conductive so that the mass loading structures 34 are insulated from and not electrically connected to the electrodes.

Figure 2:
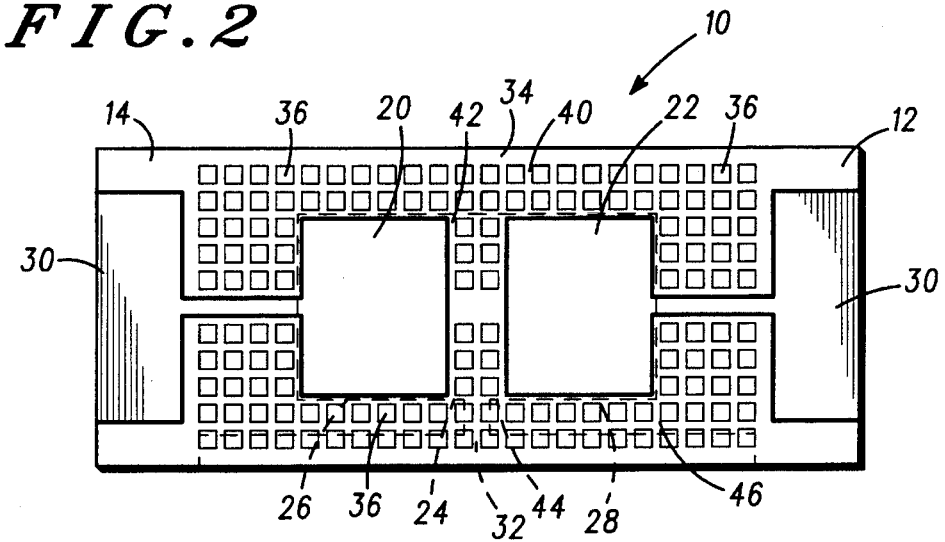
FIG. 2 is an alternate embodiment, including a top view of a rectangular crystal blank, showing a plurality of mass loading structures (tiles) surrounding the electrodes, the bottom view being a mirror image of the top view with the exception of the ground electrode tabs being different (in phantom), in accordance with the present invention.

The resonator 10 in FIGS. 1 and 2, is particularly adapted for minimizing spurious modes of oscillation for overtone crystals and filters. With the minimizing of mass loading between the electroded region 44 and non-electroded region 46 in overtone devices, heavy or lightweight metals can be used, which can simplify and facilitate mass production of such devices in certain circumstances. For example, a company that only has the ability to plate heavy metals on a crystal can now manufacture overtone oscillators.

In one embodiment, the plurality of mass loading structures 34 include a substantially repeating and uniform pattern in proximity to the electrode 18 (and 24). In a preferred embodiment, the mass loading structures 34 include first and second structures 36 and 38 located on both surfaces 14 and 16, and include substantially identical repeating patterns (or mirror images), for improved attenuation of spurious responses. According to the Energy Trapping Theory, the factor that controls the spur responses is the difference in mass loading between the electroded region 44 and the non-electroded region 46. Normally, the difference is equal to the mass loading of the electrode material, because the area surrounding the electrode is not subject to mass loading. By using the substantially repeating pattern of the mass loading structures 34, the effect of the electrode mass loading can be minimized, because the non-electroded region 46 is purposely populated with masses or structures 34. The difference in mass loading between the electroded region 44 (defined as the area between left and right sections 20 and 22 of the top electrode 18 and left and right sections 26 and 28 of bottom electrode 24) and non-electroded region 46 can therefore be decreased, with improved results, as shown for example in FIG. 4.

The geometric shapes of the structures 34 can vary widely. For example, they can include but are not limited to rectangles, squares, circles, polygons, octagons, sextagons, and the like. The shapes of structures 34 can vary widely because they do not function as individual electrodes. They collectively perform a mass loading function in the non-electroded region 46. In the embodiment shown in FIGS. 1 and 2, the structures 34 are generally rectangles or squares, for maximizing the density of these structures in the non-electroded region 46 immediately in proximity to the electrode 18 (and 24). As should be understood by those skilled in the art, other geometric shapes can be used, and are considered within the scope of this invention.

The resonator 10 can include at least one of the surfaces 14 and 16 having a high density of structures 34 positioned substantially immediately in proximity to at least one of the electrodes 18 and 24. In a preferred embodiment, the mass loading structures 36 and 38 are positioned immediately in proximity to the electrodes 18 and 24 on both surfaces 14 and 16, in the surrounding (non-electroded) region 46. In a preferred embodiment, the (tiles) structures 36 and 38 include an area at least as large as the areas of the electrodes 18 and 24, and preferable are larger and are placed immediately adjacent to the electrodes 18 and 24, for an improved reduction of spurs. The top and bottom structures 36 and 38 collectively approach the weight per unit area of the weight per unit area of the electrodes 18 and 24, to minimize the difference in the mass loading between the electroded region 44 and non-electroded region 46.

Also in a preferred embodiment, the thickness of the structures 36 and 38 are substantially equal to the thickness of the top and bottom electrodes 18 and 24, for ease of manufacturing and improved attenuation of spurious responses.

The gaps, defined by spacings 40 and 42 between the various structures, should normally be kept small, so as to allow the structures 34 to cover a significant area of the non-electroded region 46, for improved responses. In a preferred embodiment, the structures 36 and 38 cover at least 50% or more of the non-electroded region 46, for improved responses.

As illustrated in FIG. 1, each of the structures 34 has an area smaller than one of the electrodes 18 and 24, because they function as mass loading devices. If the structures 34 were larger than the electrodes, they could exhibit their own resonant effects, which may not be particularly desirable in this application.

The thicknesses of the first and second mass loading structures 36 and 38 and the electrodes 18 and 24 can be substantially similar. In one embodiment, they are both made out of a conductive material. In a preferred embodiment, the material is a metal such as aluminum (light metal), or gold or silver (heavy metals) for using conventional application techniques to the crystal 12.

The electrodes must be made of a conductive material so there is flow of electrical charges to and from the device, whereas the structures 34 can be made of a conductive or non-conductive material. There are substantially no restrictions on the electrical properties of the material of structures 34, because they do not perform any significant electrical function. However, the material used for structures 34 should be sufficiently stable to minimize the introduction of any significant shifts to the device frequency. For mass production purposes, the structure 34 and electrodes 18 and 24 are made conductive and can be suitably plated or masked in one step.

The electroded region 44 includes a natural resonance frequency and the non-electroded region 46 includes another natural resonance frequency, having a substantially small predetermined difference, because of the minimal difference in mass between the electroded region 44 and non-electroded region 46. More particularly, the electroded region 44 has a natural frequency which is determined primarily by the mass of the electrode material and the thickness of the quartz blank in that region. The non-electroded region 46 has a natural frequency determined primarily by the mass of the material of structures 34 and the thickness of the quartz blank in the non-electroded region. The existence of the mass structures 34 reduces the difference in frequency between these two regions. As this difference becomes smaller fewer undesired spurious responses can be trapped in the electroded region thereby improving the spurious response characteristics of the device.

A more detailed explanation follows. Any resonant structure such as a blank with electrodes has a series of natural resonant frequencies which are determined by the nature of the material, the dimensions of the material and any constraints placed on the acoustic system such as the addition of mass to the surface. The combination of the basic material and the dimensions of the material gives rise to it's natural frequency. AT crystals are made by selecting a particular orientation with respect to the crystallographic axes in quartz and then are fabricated into a thin disk. This shaping enhances the "thickness shear" mode of vibration which is the desired mode of vibration.

Unfortunately, there are a series of vibrations which are also thickness shear types of vibration and are related to the desired thickness shear. Fortunately they are always slightly higher in frequency than the desired mode but they do cause some problems such as spurious responses in filter crystals.

The weakness or strength of a response is related to the "Q" or resistance of that mode of vibration. A high "Q" or good response means very little of the energy which drives the vibration is lost (i.e., the resistance of that mode is low).

A vibration can only travel through the material if it's frequency is less than the natural frequency of the material. The desired mode's frequency is exactly equal to the natural frequency of the electroded area. The area outside of the electrode is higher. This causes the desired mode to be "trapped" under the electrode. If a mode has a frequency higher than the unelectroded region it will be able to travel beyond the electroded region towards the edges of the crystal blank.

"Trapped" vibrations have a very high Q because there is little loss of energy outside of the electroded region. "Untrapped" vibrations (frequencies higher than the nonelectroded region) can travel beyond the electrode region and therefore can lose energy to other structures such as the edge of the blank or the mounting structure. This causes them to have a low "Q" or weak responses.

Therefore there is a range of frequencies between the frequency of the electroded region and the frequency of the nonelectroded region where spurs can become trapped causing them to have a high Q and a strong response. Adding mass outside the electrode causes the frequency of the nonelectroded region to get closer to the frequency of the electroded region thereby narrowing the range of frequencies where spurs can be trapped. This is the reason the added mass outside the electrode works. It allows the spurious frequencies to escape the electroded region and dissipate energy. This reduces their "Q" (increases their resistance) and makes their response very weak, thus minimizing spurious responses.

In a preferred embodiment, the piezoelectric resonator 10 includes a piezoelectric crystal plate 12 having opposite surfaces defined as a first surface 14 and a second surface 16; electrodes 18 and 24 are positioned in overlying relationship on each of the surfaces 14 and 16, the electrodes 18 and 24 are substantially coextensive and opposite, and provide a primary frequency mode of operation and spurious modes upon suitable energization; and a plurality of mass loading structures 34 on first and second surfaces 14 and 16 substantially surrounding the electrodes 18 and 24. This structure helps to minimize spurious responses and is adapted to improving mass production of resonators, because of the simple design. In addition, this structure is adapted to using heavier metals such as gold or silver for making overtone devices, allowing more flexibility in manufacturing as well.

In a preferred embodiment, the mass loading structures 34 include a substantially repeating pattern on both surfaces 14 and 16 for minimal differences in mass loading between the electroded and unelectroded regions 44 and 46.

The resonator 10 can be made in the following manner. The resonator can be made with a photolithographic process. The process starts with generally a 2" square wafer. The wafer is etched in an acid until it becomes the desired thickness. This thickness will determine the operating frequency of the final crystal.

Next, a metal layer whose thickness can vary from 300 to 5,000 angstroms, is placed over the etched wafer. Preferably, silver or gold is used as the metal. This metal layer covers both sides of the wafer, and can be used to make the electrodes on each individual crystal.

Once the metal conductive layer is placed on the wafer, a layer of photoresist is placed on both sides of the wafer on the metal layer. The photoresist breaks down in the presence of ultra-violet light. This can provide a very accurate pattern to be placed on the photoquartz wafer.

The next step involves masking both surfaces of the wafer and exposing the wafer to ultra-violet light. This enables the wafer to be divided up into about 140 individual crystal filters.

A second mask can then be placed on the wafers. The second mask defines the electrode pattern and the tiled pattern (mass loading structures) on the plurality of individual crystals.

After these two masks have been exposed, the conductive material can be removed (where the photoresist was exposed to ultra-violet light). This will enable the conductive material to be etched away and the 140 or so crystals to be etched out of the wafer.

The remaining photoresist is stripped off the wafer and what remains is a 2" square wafer with about 140 individual crystal resonators on it.

COMPARATIVE EXAMPLE A

Figure 3:
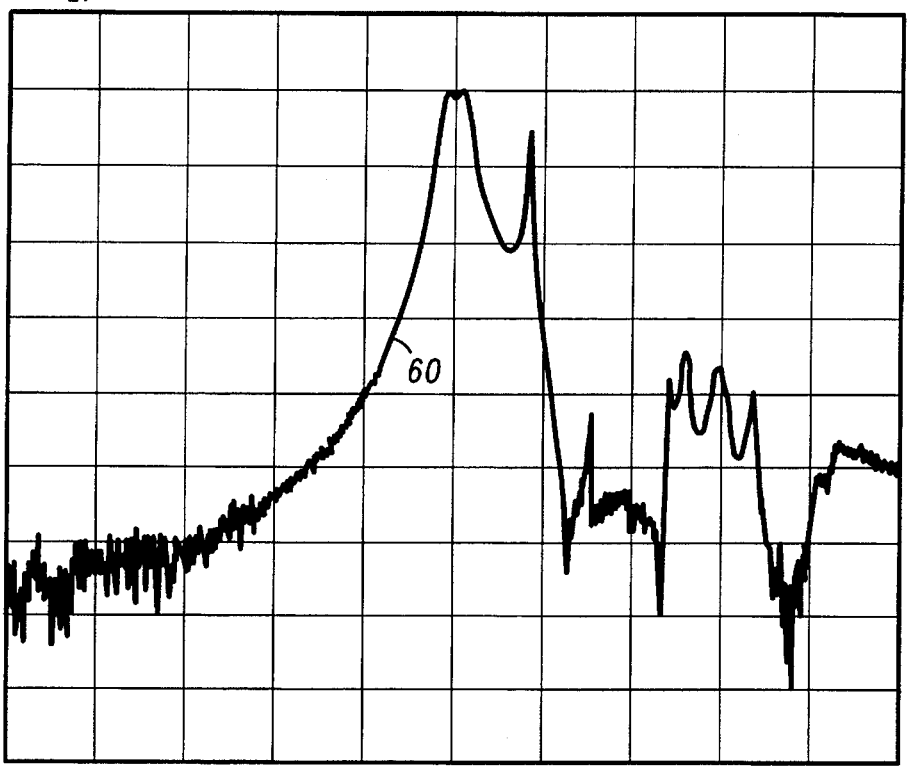
FIG. 3 is a frequency response of a crystal blank without the mass loading structures of the present invention.

The crystal filter as shown in FIG. 2 was built with the exception that the tiles (mass loading structures 34) were not present in Comparative Example A. The dimensions of the filter were 0.18" by 0.10". The device was a third overtone quartz crystal filter having a center frequency of about 46 MHz and a bandwidth of 20 kHz. The electrodes were made out of gold and had a thickness of 2000 angstrom. This conventional resonator exhibited a frequency response 60 as shown in FIG. 3. Disadvantageously, a number of unwanted spurious responses were exhibited. The spur resonances in response 60 are very significant with the strongest resonance being 6 dB below the filter passband.

EXAMPLE 1

A second filter was built as shown in FIG. 2, and the tile similar to that described with respect to Comparative Example A, however Example 1 included the tiles (or mass loading structures) covering most of the unelectroded area of the quartz substrate. The electrodes and tiles were made of gold having thickness of 2000 angstrom. The tile structures were of a square shape with a side dimension of 0.003". The spacing between the tile structures was 0.001". The frequency response corresponding to Example 1, is shown in FIG. 4 as item 62. Advantageously, the frequency response 62 in FIG. 4, shows reduced spur responses, with the strongest spur being about 18 dB below the filter passband. The other electrical characteristics, in particular corresponding to the filter passband, were similar to that described with respect to Comparative Example A. Example 1 exhibited a substantial improvement in the reduction of spurs as compared to Comparative Example A. This design can be easily replicated in large volumes, without major processing alternations or additional expenses capital outlays for equipment and the like.

Although the present invention has been described with reference to certain preferred embodiments, numerous modifications and variations can be made by those skilled in the art without departing from the novel spirit and scope of this invention.

What is claimed is:

1. A piezoelectric resonator with an attenuated spurious frequency response, comprising:

a piezoelectric crystal plate having opposite surfaces;

an electrode positioned in overlying relationship on each of the opposite surfaces, the electrodes being substantially coextensive and opposite, defining an electroded area, and providing a primary frequency mode of operation and spurious frequency modes upon suitable energization; and a plurality of mass loading structures on at least one of the surfaces substantially surrounding at least one of the electrodes defining an unelectroded area, the unelectroded area and the electroded area having substantially similar masses per unit area.

2. The piezoelectric resonator of claim 1, wherein the plurality of mass loading structures include a substantially repeating pattern.

3. The piezoelectric resonator of claim 1, wherein the mass loading structures are located on both surfaces and includes substantially identical and opposite repeating patterns.

4. The piezoelectric resonator of claim 1, wherein the mass loading structures include the same geometric shapes.

5. The piezoelectric resonator of claim 1, wherein at least one of the surfaces includes the plurality of mass loading structures having a minimal spacing therebetween to provide a high density of the plurality of mass loading structures substantially immediately in proximity to at least one of the electrodes, whereby the mass per unit area of the plurality of mass loading structures and the mass per unit area of the electrodes are substantially similar, and a total area occupied by the plurality of mass loading structures is at least equal to or greater than an area occupied by the electrodes.

6. The piezoelectric resonator of claim 1, wherein each of the mass loading structures includes a substantially smaller area than one of the electrodes.

7. The piezoelectric resonator of claim 1, wherein the mass loading structures and the electrodes include thicknesses which are substantially the same.

8. The piezoelectric resonator of claim 1, wherein the electrodes include a region in proximity thereto including a natural resonance frequency of the electroded region and the plurality of mass loading structures include a natural resonance frequency of the region surrounding the electrodes, having a substantially minimal difference in frequency.

9. A piezoelectric resonator with an attenuated spurious frequency response, comprising:

a piezoelectric crystal plate having opposite surfaces;

an electrode positioned in overlying relationship on each of the opposite surfaces, the electrodes being substantially coextensive and opposite defining an electroded area, and providing a primary frequency mode of operation and spurious frequency modes upon suitable energization; and a plurality of mass loading structures on both of the opposite surfaces substantially surrounding the electrodes defining an unelectroded area, the mass loading structures and the electrodes comprise substantially similar material and the unelectroded area and the electroded area have substantially similar masses per unit area.

10. The piezoelectric resonator of claim 9, wherein the plurality of mass loading structures include a substantially repeating pattern and include about 50% or more of a non-electroded region surrounding the electrodes.

11. The piezoelectric resonator of claim 9, wherein the mass loading structures include the same geometric shapes and masses.

12. The piezoelectric resonator of claim 9, wherein the thickness of the mass loading structure and the electrodes are substantially similar.

13. The piezoelectric resonator of claim 9, wherein the electrodes include a region in proximity thereto including a natural resonance frequency of the electroded region and the plurality of the mass loading structures includes a natural resonance frequency of the regions surrounding the electrodes, said electroded region and surrounding region having a substantially minimal different in resonant frequencies.

* * * * *